US008558313B2

(12) United States Patent
Chou et al.

(10) Patent No.: US 8,558,313 B2
(45) Date of Patent: Oct. 15, 2013

(54) BULK SUBSTRATE FET INTEGRATED ON CMOS SOI

(75) Inventors: Anthony I. Chou, Hopewell Junction, NY (US); Arvind Kumar, Hopewell Junction, NY (US); Shreesh Narasimha, Hopewell Junction, NY (US); Ning Su, Fishkill, NY (US); Huiling Shang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/425,681

(22) Filed: Mar. 21, 2012

(65) Prior Publication Data

US 2012/0187492 A1 Jul. 26, 2012

Related U.S. Application Data

(63) Continuation of application No. 12/683,456, filed on Jan. 7, 2010, now Pat. No. 8,232,599.

(51) Int. Cl.
*H01L 27/088* (2006.01)

(52) U.S. Cl.
USPC .................................... 257/350; 257/E27.06

(58) Field of Classification Search
USPC ......... 257/243, 335–337, 344–350, 400–408, 257/E27.06
See application file for complete search history.

(56) References Cited

U.S. PATENT DOCUMENTS 6,930,361 B2 * 8/2005 Inaba ........................... 257/408
7,186,596 B2 3/2007 Min et al.

OTHER PUBLICATIONS

Chan et al, "SOI/Bulk Hybrid Technology on SIMOX Wafers for High Performance Circuits with Good ESD Immunity," IEEE Electron Device Letters, vol. 16, No. 1, Jan. 1995, pp. 11-13.*
Bashir et al., "Back-Gated Buried Oxide MOSFET's in a High-Voltage Bipolar Technology for Bonded Oxide/SOI Interface Characterization," IEEE Electron Device Letters, vol. 19, No. 8, Aug. 1998, pp. 282-284.
Chan et al., "SOI/Bulk Hybrid Technology on SIMOX Wafers for High Performance Circuits with Good ESD Immunity," IEEE Electron Device Letters, vol. 16, No. 1, Jan. 1995, pp. 11-13.
Salman et al., "ESD Protection for SOI Technology Using Under-the-BOX (Substrate) Diode Structure," IEEE Transactions on Device and Materials Reliability, vol. 6, No. 2, Jun. 2006, pp. 292-299.

* cited by examiner

*Primary Examiner* — Calvin Lee
*Assistant Examiner* — Monica D Harrison
(74) *Attorney, Agent, or Firm* — Joseph Petrokaitis; Matthew C. Zehrer

(57) ABSTRACT

An integrated circuit is provided that integrates an bulk FET and an SOI FET on the same chip, where the bulk FET includes a gate conductor over a gate oxide formed over a bulk substrate, where the gate dielectric of the bulk FET has the same thickness and is substantially coplanar with the buried insulating layer of the SOI FET. In a preferred embodiment, the bulk FET is formed from an SOI wafer by forming bulk contact trenches through the SOI layer and the buried insulating layer of the SOI wafer adjacent an active region of the SOI layer in a designated bulk device region. The active region of the SOI layer adjacent the bulk contact trenches forms the gate conductor of the bulk FET which overlies a portion of the underlying buried insulating layer, which forms the gate dielectric of the bulk FET.

5 Claims, 17 Drawing Sheets

BULK SUBSTRATE FET INTEGRATED ON CMOS SOI

CROSS-REFERENCE TO RELATED APPLICATION

This application is a continuation of currently co-pending U.S. patent application Ser. No. 12/683,456, filed on Jan. 7, 2010, the subject matter of which is incorporated herein by reference in its entirety.

FIELD OF THE INVENTION

The present invention broadly relates to the structure and manufacture of integrated circuits, and more particularly to integration of high performance SOI CMOS devices with high voltage bulk substrate FETs.

BACKGROUND

SOI (Silicon-on-Insulator) CMOS (Complementary metal-oxide semiconductor) technology can provide high performance devices.

Many applications require FETs that can withstand very high voltages. For example, in automobile applications and in television applications, voltages in the range 12V-24V may be required. However, providing both high performance and high voltage devices on the same chip is challenging using conventional methods.

It would be desirable to provide a cost-effective structure and method to integrate both high performance SOI CMOS devices and high voltage bulk devices on a single chip.

SUMMARY OF THE INVENTION

The present invention provides, according to one aspect, an integrated circuit comprising a semiconductor wafer comprising: a semiconductor on insulator (SOI) device region including a semiconductor substrate, a first SOI semiconductor layer over the semiconductor substrate, and a buried insulating layer formed between the semiconductor substrate and the first SOI semiconductor layer, and said semiconductor wafer comprising a bulk device region; an SOI field effect transistor (FET) formed in said SOI device region comprising: an SOI gate stack comprising an SOI gate dielectric atop said first SOI semiconductor layer and an SOI gate conductor atop said SOI gate dielectric; and SOI source/drain regions in said first semiconductor layer adjacent said SOI gate stack; a bulk FET formed in said bulk device region comprising: a bulk gate stack comprising a bulk gate dielectric over said semiconductor substrate and a bulk gate conductor atop said bulk gate dielectric, wherein said bulk gate dielectric has a top surface that is substantially coplanar with a top surface of said buried insulating layer in said SOI device region; and bulk source/drain regions in said semiconductor substrate adjacent said bulk gate stack.

According to another aspect of the invention, a method of manufacturing an integrated circuit is provided, the method comprising the steps of: providing an semiconductor on insulator (SOI) wafer including a semiconductor substrate, a first semiconductor layer over the semiconductor substrate, and a buried insulating layer formed between the semiconductor substrate and the first semiconductor layer, said SOI wafer including a predefined bulk device region and a predefined SOI device region; forming shallow trench isolation (STI) regions and at least one bulk active region in said first semiconductor layer in said bulk device region and at least one SOI active region in said SOI device region; forming an SOI gate stack atop said at least one SOI active region; forming bulk contact trenches through said first semiconductor layer and said buried insulating layer adjacent said at least one bulk active region, so that said semiconductor substrate is exposed at the bottom of said bulk contact, wherein a portion of said at least one active region between said adjacent bulk contact trenches comprises a bulk gate conductor of a bulk gate stack and a portion of said buried insulating layer under said bulk gate conductor comprises a bulk gate dielectric of said bulk gate stack; forming bulk source/drain regions in said exposed semiconductor substrate by dopant implant through said bulk contact trenches adjacent said bulk gate stack; and forming SOI source/drain regions in said first semiconductor layer adjacent said SOI gate stack.

According to yet another aspect of the invention, an integrated circuit is provided comprising: a semiconductor on insulator (SOI) wafer including a semiconductor substrate, a first semiconductor layer over the semiconductor substrate, and a buried insulating layer formed between the semiconductor substrate and the first semiconductor layer, said SOI wafer including a bulk device region and an SOI device region; a bulk field effect transistor (FET) formed in said bulk device region comprising: a bulk gate stack comprising a bulk gate dielectric comprising a portion of said buried insulating layer and a bulk gate conductor comprising a portion of said first semiconductor layer; and bulk source/drain regions in said semiconductor substrate adjacent said bulk gate stack; and an SOI FET formed in said SOI device region comprising: an SOI gate stack comprising an SOI gate dielectric atop said first semiconductor layer and an SOI gate conductor atop said SOI gate dielectric; and SOI source/drain regions in said first semiconductor layer adjacent said SOI gate stack.

The foregoing and other features and advantages of the invention will be apparent from the following detailed description of the invention.

BRIEF DESCRIPTION OF THE DRAWINGS

Reference is made to the exemplary drawings wherein like elements are numbered alike in the several figures, which are not necessarily drawn to scale.

DETAILED DESCRIPTION OF THE INVENTION

Figure 1:
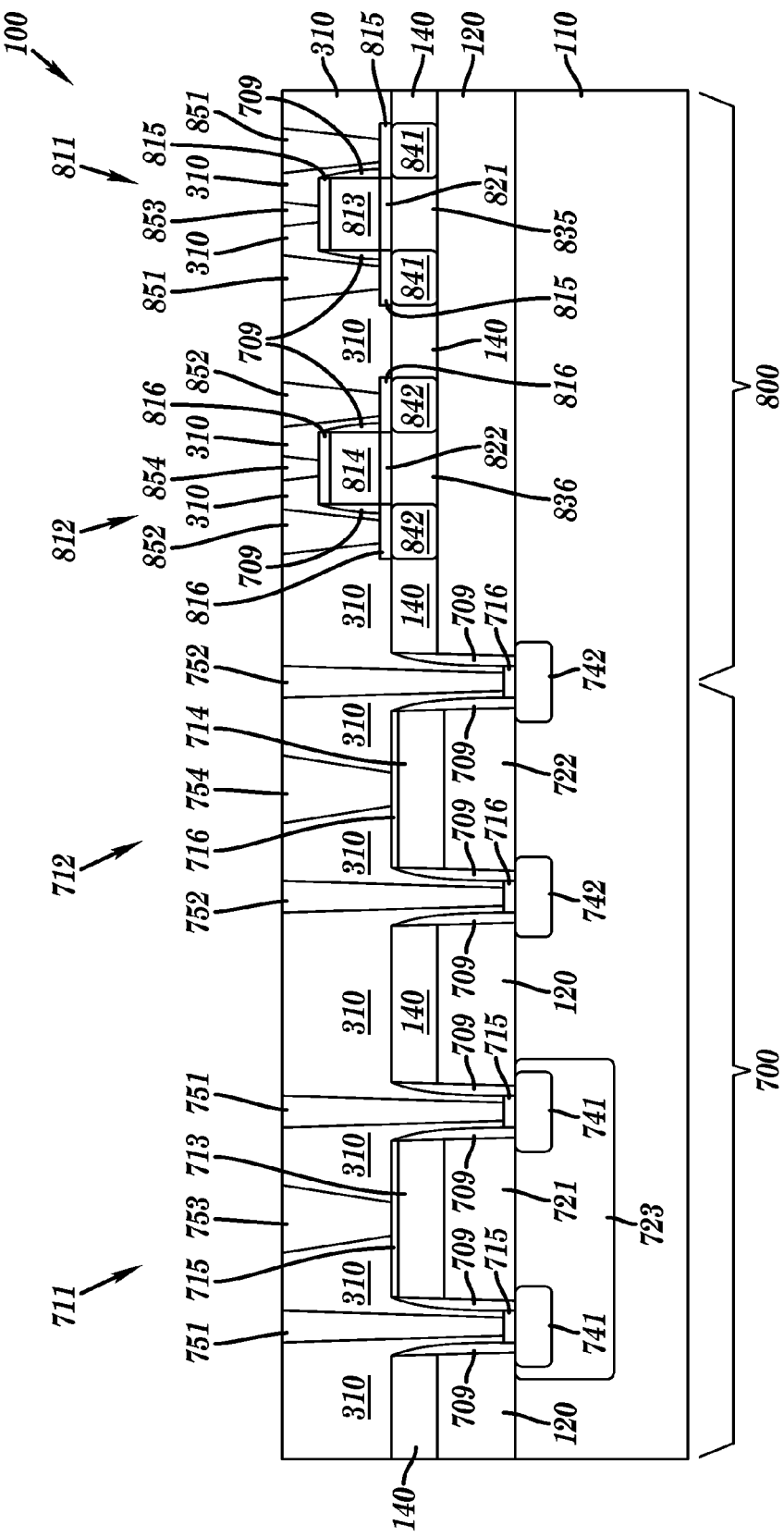
FIG. 1 illustrates an embodiment of a structure in accordance with the present invention.

This invention presents a method and structure for integrating high voltage bulk FETs with high performance SOI CMOS devices on a single chip. FIG. 1 illustrates a schematic cross-section of one embodiment of an integrated circuit chip structure 100 in accordance with the invention. The chip 100 includes a high voltage bulk device region 700 and a SOI device region 800.

Figure 2:
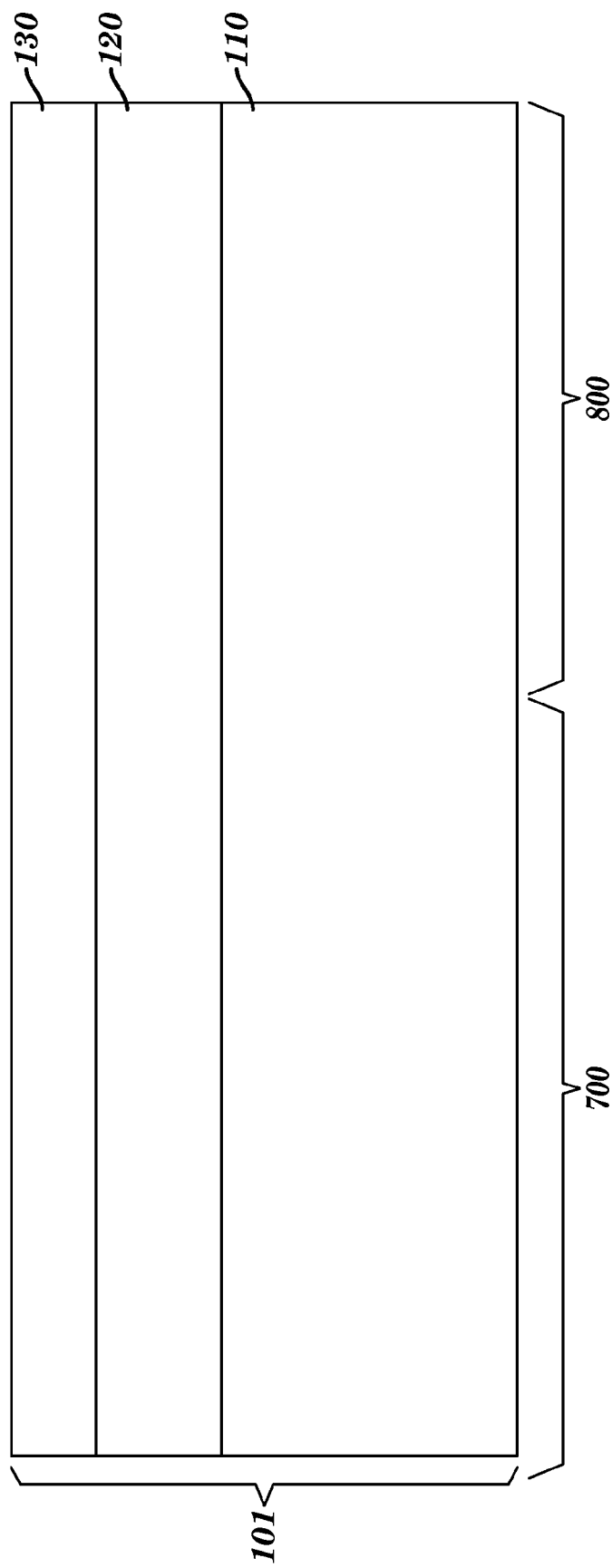
FIGS. 2-11 illustrate intermediate structures formed during process steps of an embodiment in accordance with the present invention.

FIGS. 2-11 illustrate cross-sections of a chip 100 during one embodiment of a process for making a chip 100 in accordance with the invention. Referring to FIG. 2, an SOI wafer 101 is provided, including a semiconductor substrate 110, a buried insulator 120, such as a buried oxide (BOX), formed on the substrate 110, and a semiconductor layer 130 over the BOX layer 120. The substrate 110 can be a P-substrate, N-substrate or a hybrid-orientation (i.e. having different crystal orientation) substrate. The buried insulator 120 can be an oxide, nitride, oxynitride or other insulation materials. In a preferred embodiment, the buried insulator layer 120 has a thickness in the range 10 nm to 200 nm, but the invention is not so limited. The SOI layer 130 can comprise any crystalline semiconductor, such as Si, SiGe, Ge, GaAs or other compound semiconductors. In a preferred embodiment, the semiconductor layer 130 has a thickness in the range 10 nm to 100 nm, but the invention is not so limited. The substrate 110 and SOI layer 130 may be different materials.

Figure 3:
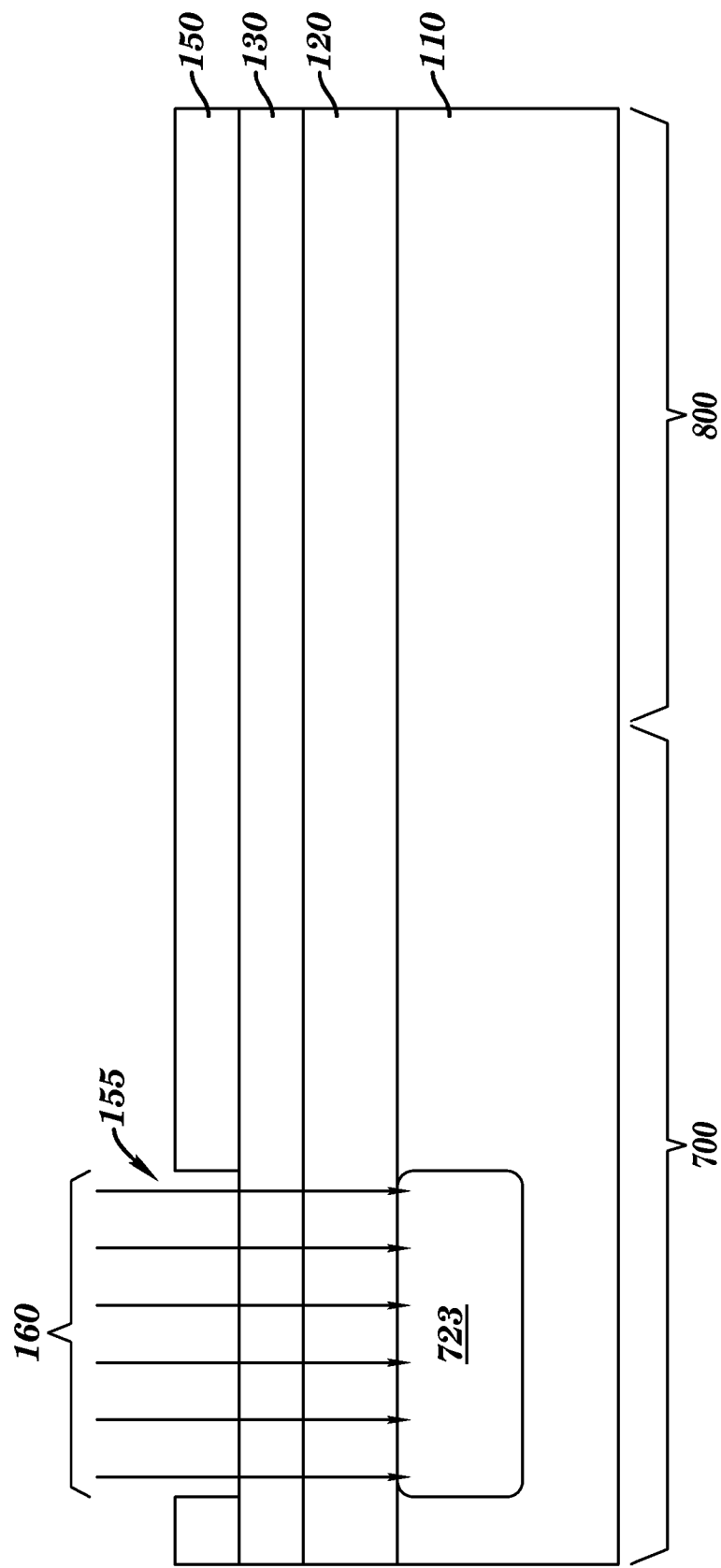

Next, referring to FIG. 3, a dopant 160 is optionally implanted that is opposite the type or polarity of the substrate type, using energy such that a well region 723 is formed in the substrate 110 under the BOX layer 120. The dopant implant 160 is performed through a patterned opening 155 in a photosensitive (resist) layer 150 is formed over the wafer 101, the opening 155 located in the high voltage bulk region 700. The resist layer 150 should have a thickness sufficient to prevent implant of the dopant in the wafer other than through the opening 155. In the case where the semiconductor substrate 110 is a P-type substrate, an N-type dopant may be implanted into the P-type substrate 110, and may any suitable N-type dopant, such as phosphorus, arsenic, and the like. Optionally, P-type dopant (not shown) may also be implanted into the P-type substrate 110 to form a second well implant. Having well implants may be desirable for tuning and optimization of bulk FET devices, as understood by one skilled in the art, but the invention is not so limited.

Figure 4A:
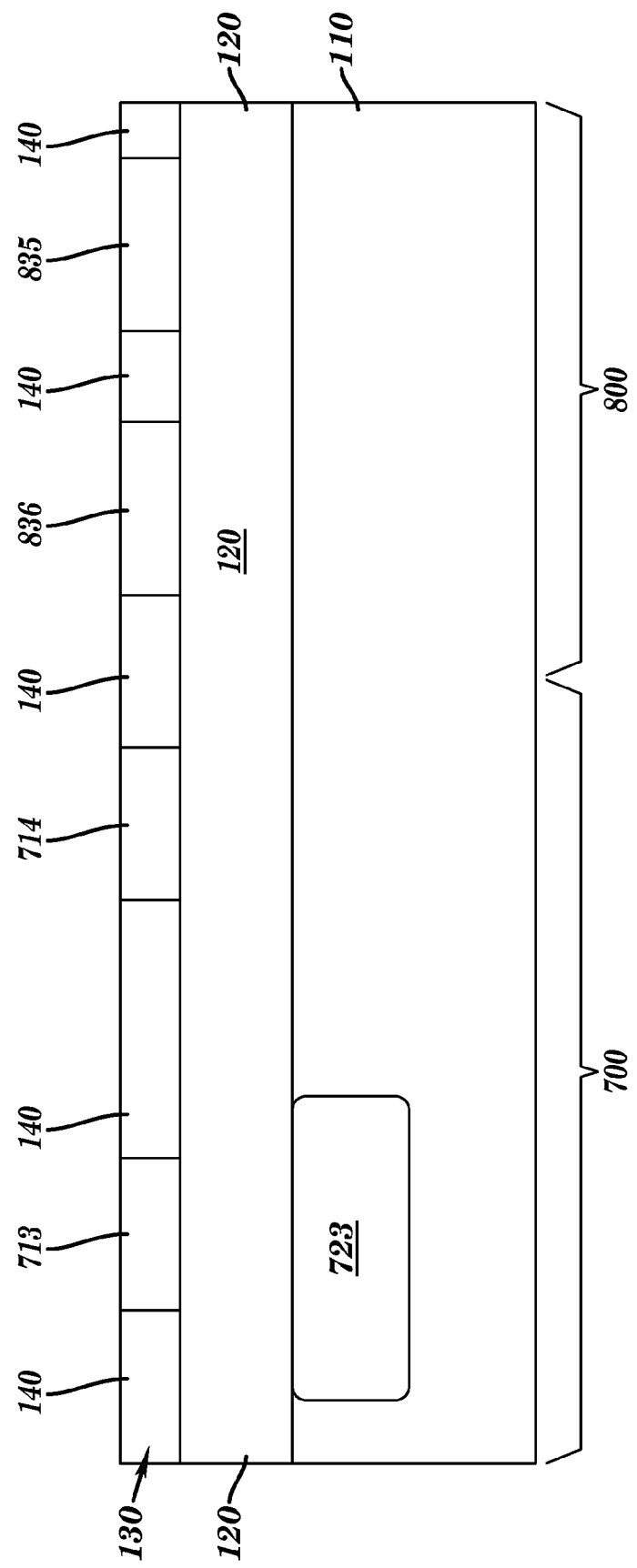
Figure 4B:
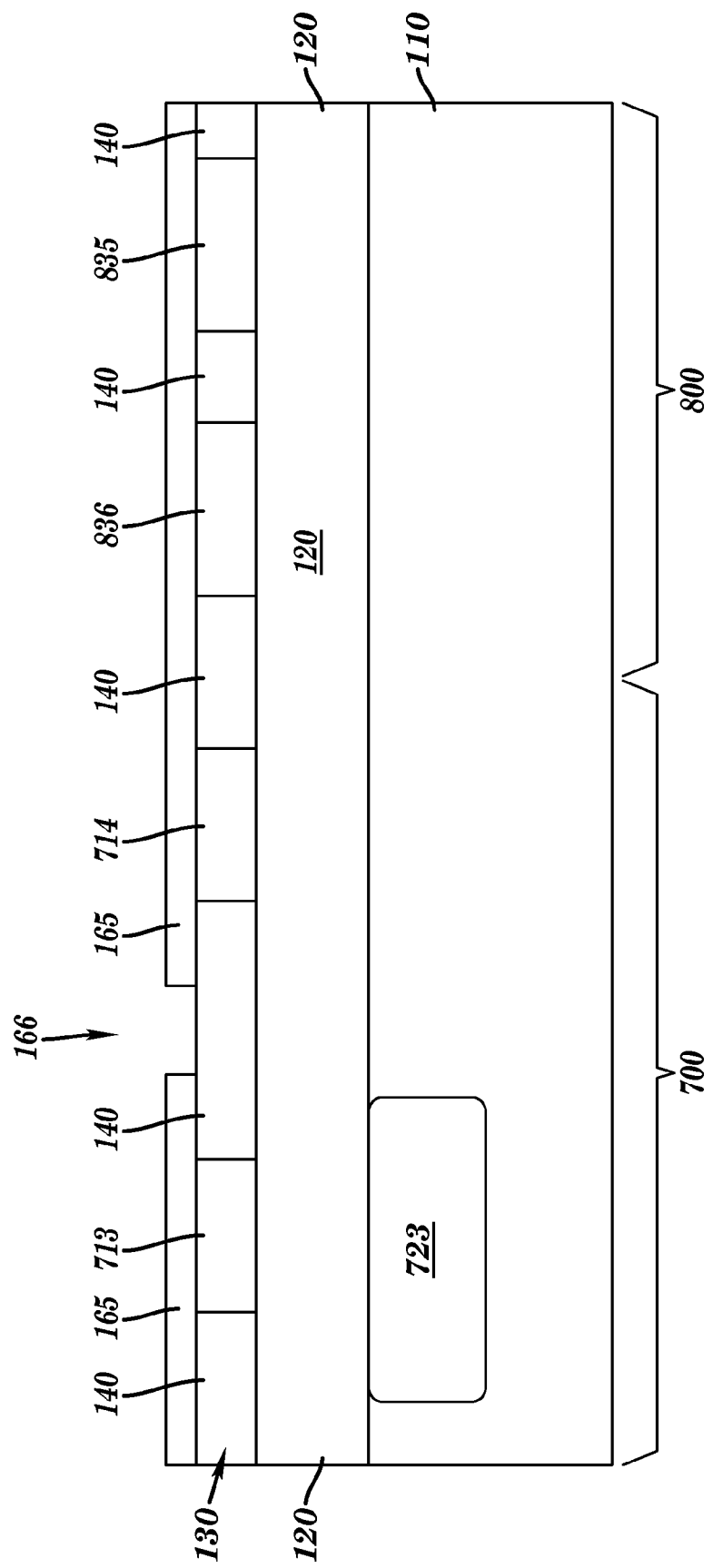
Figure 4C:
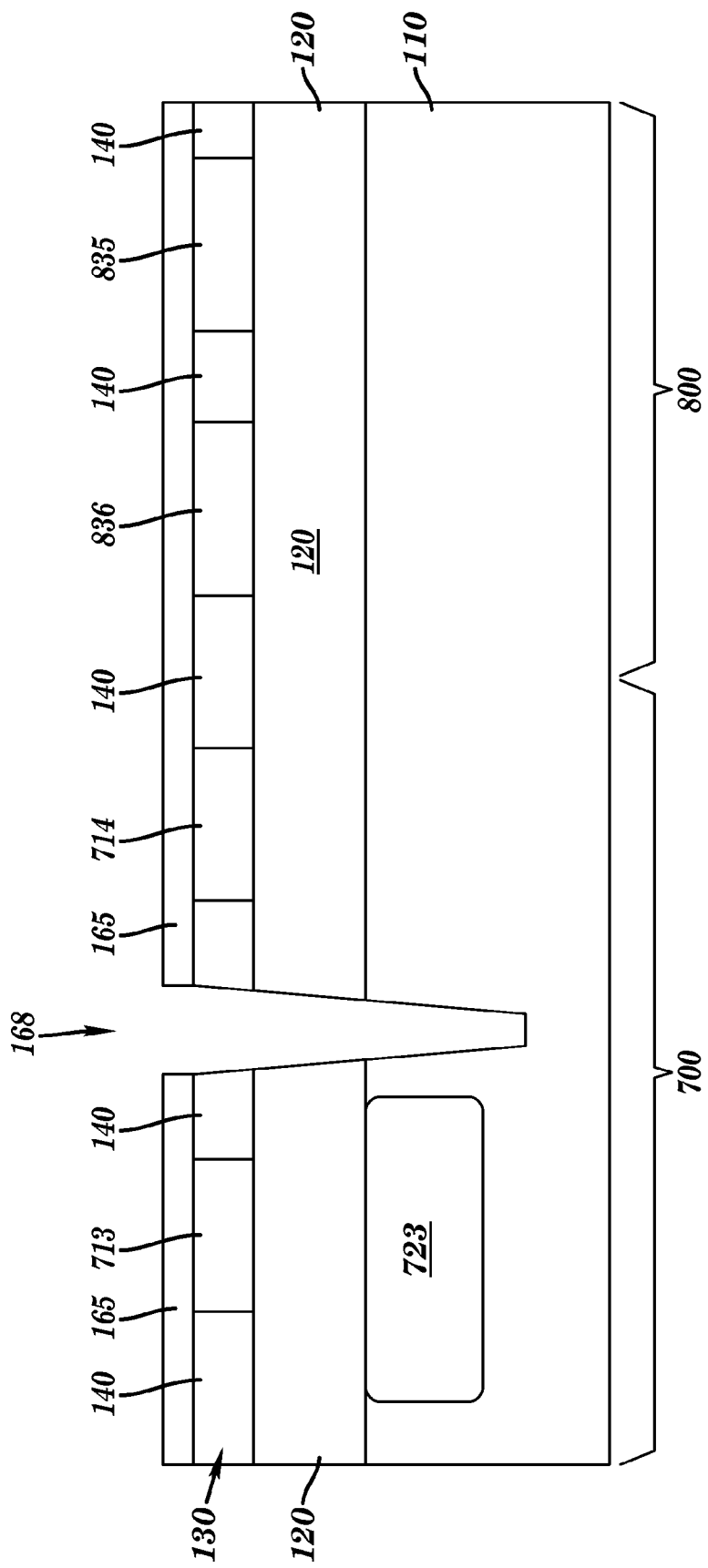

Next, the resist layer 150 is removed. Using standard processes, shallow trench isolation (STI) formation, STI regions 140 are formed. In addition, active regions 713, 714, 835, 836 are formed from the SOI layer 130 as a result of the STI formation, according to standard processes In accordance with the invention, in the SOI region 800, active regions 835, 836 will function as diffusion regions, where the conduction channel forms for high performance SOI FET devices 811, 812; while in the bulk region 700, active regions 713, 714 will act as gate of the bulk devices 711, 712. The resulting structure is illustrated in FIG. 4A.

Figure 4D:
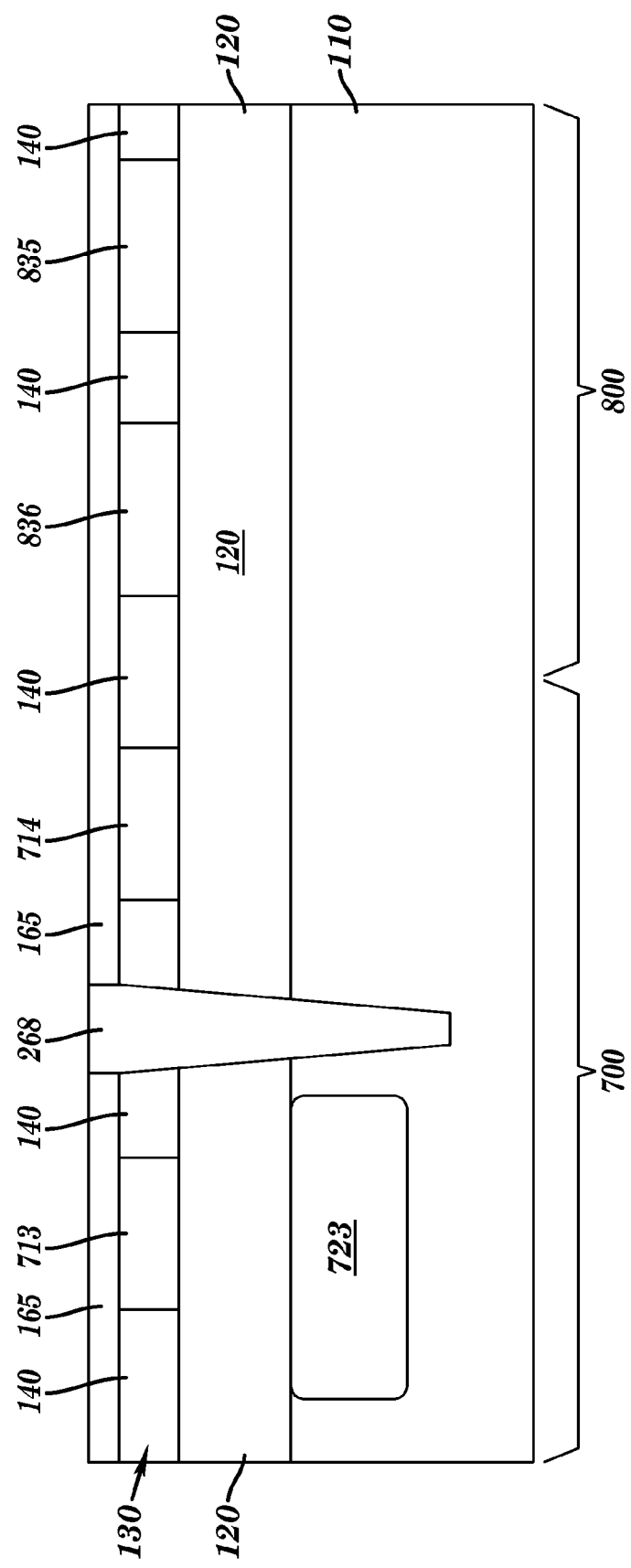
Figure 4E:
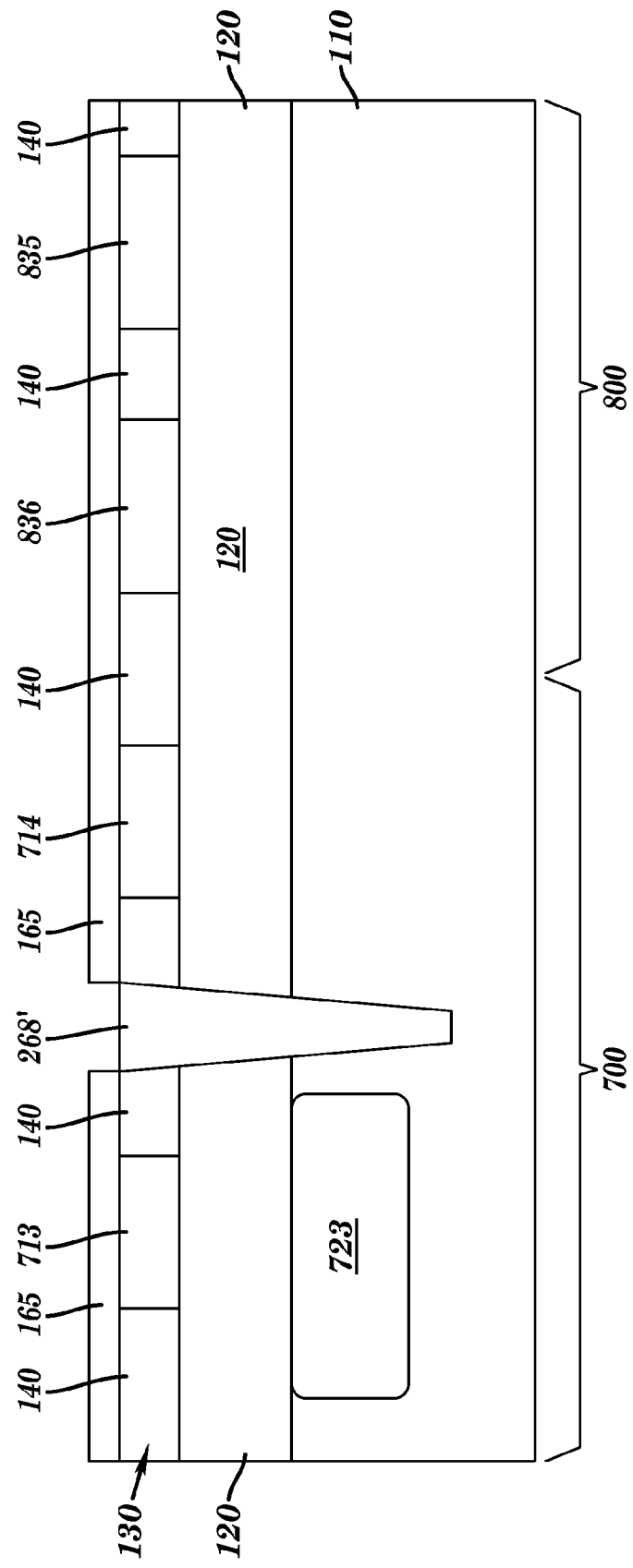
Figure 4F:
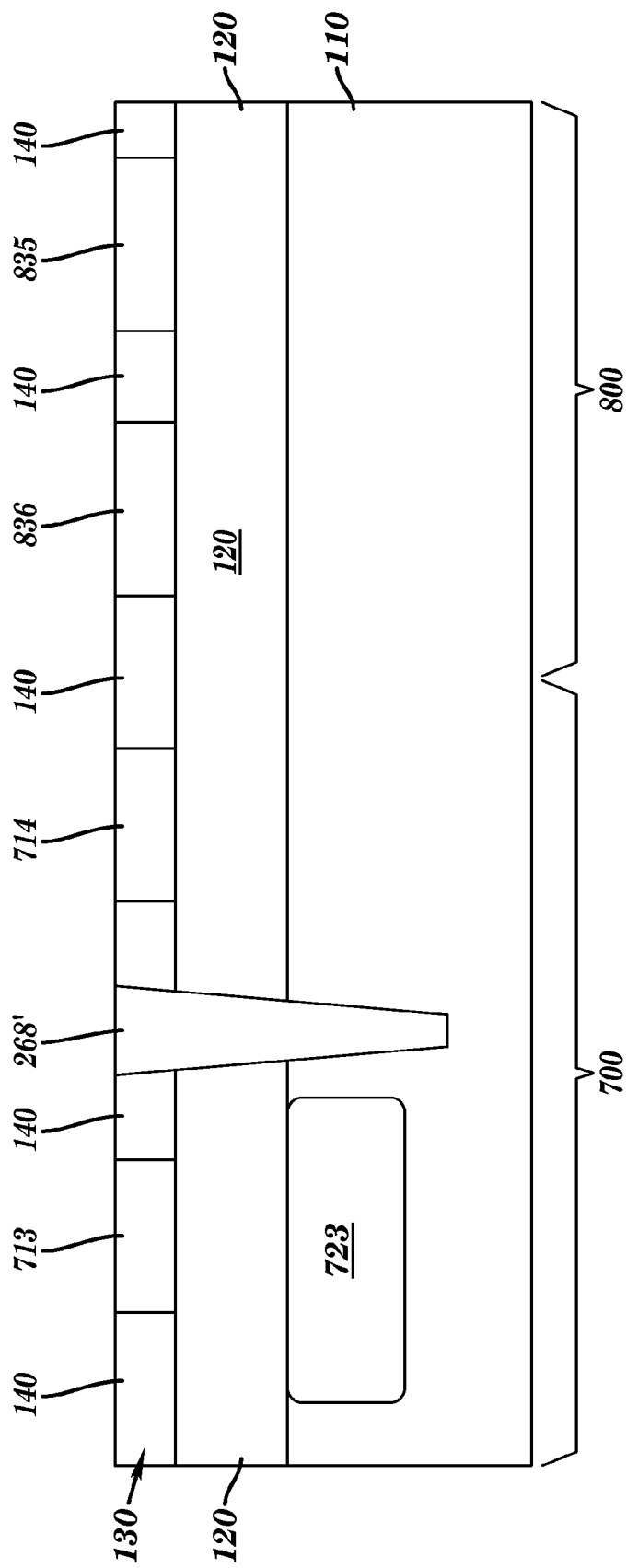

Optionally, a deep isolation structure may be included to isolate devices in the bulk region 700, if necessary. For example, referring to FIG. 4B, after the formation of the STI regions 140 in the bulk region 700, a patterned hardmask 165 may be deposited on the wafer with an opening 166 exposing a bulk STI region 140. The hardmask 165 may be any suitable hardmask material, such as $Si_3N_4$. Next, an anisotropic RIE etch is performed to form a trench 168 through the exposed STI 140, the buried insulating layer 120 and the substrate 110 to a depth sufficient to provide electrical isolation, resulting in the structure illustrated in FIG. 4C. The trench 168 should have dimensions such that it can be completely filled by a dielectric. Next, a dielectric layer (not shown), such as oxide, may be blanket deposited over the wafer so as to fill the trench 168. The dielectric layer is then planarized, for example, using CMP stopping on the hardmask 165, to form a dielectric plug 268. The resulting structure is illustrated in FIG. 4D. The dielectric plug 268 is then recessed, for example, using an HF wet etch, to have a top surface substantially coplanar with the STI region 140. The resulting structure, with the recessed plug 268', is illustrated in FIG. 4E. Next, the hardmask 165 may be stripped, for example, by using phosphoric acid. The resulting structure with the optional deep isolation 268' is illustrated in FIG. 4F.

Figure 5:
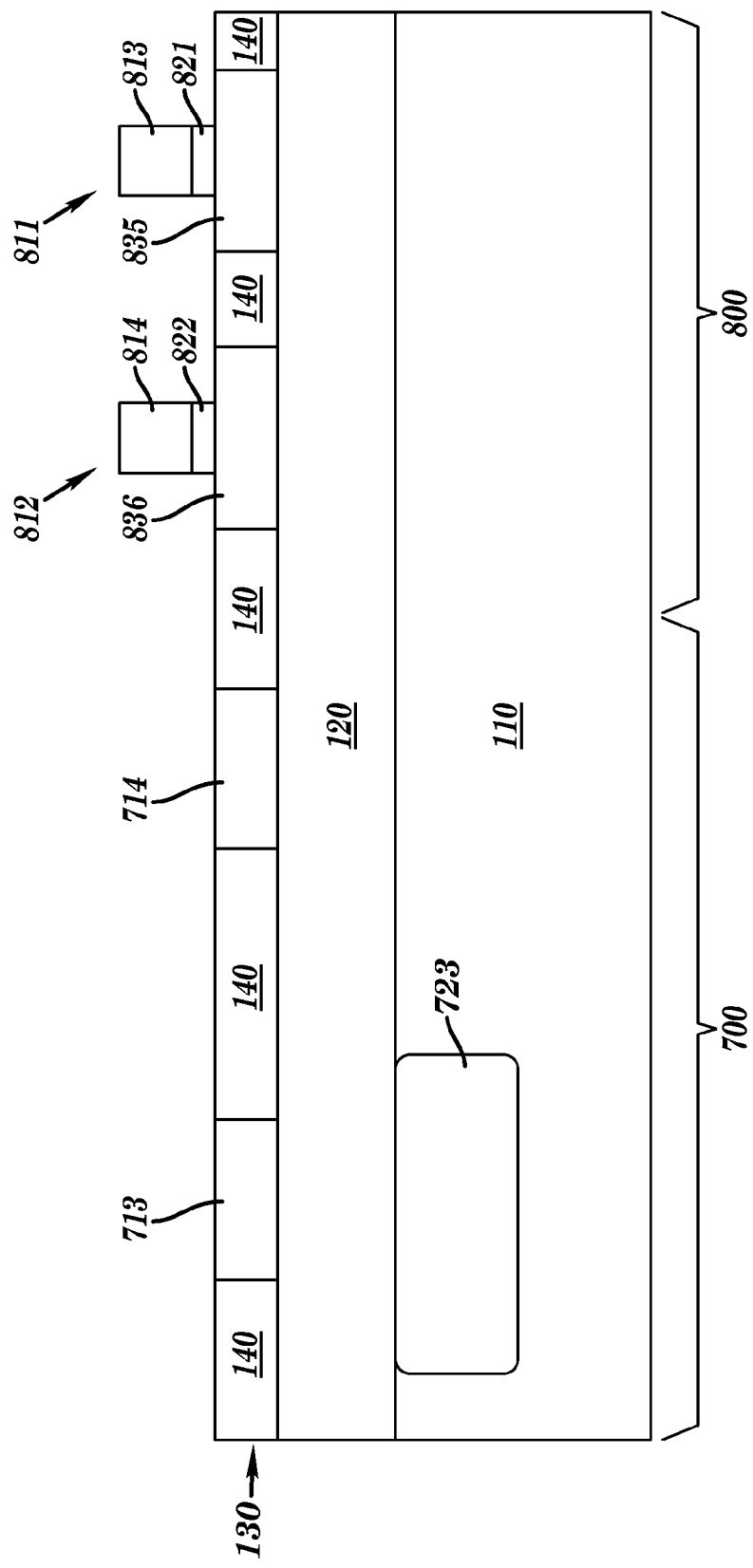

Next, gate stacks 811, 812 are formed in the SOI region 800, using any suitable process, currently known or developed in the future. The gate stack 811 may include a gate conductor 813 and a gate dielectric 821. Similarly, gate stack 812 includes a gate conductor 814 and gate dielectric 822. For example, a thin dielectric layer may be grown on the SOI layer, followed by forming a layer of conductive material on the thin dielectric layer. The conductive layer and the thin dielectric layer are then patterned to form gate stacks 811, 812. The resulting structure is illustrated in FIG. 5. The gate conductors 814, 815 may comprise any suitable gate conductor material, such as polysilicon, nitride materials (e.g. TiN), and metals or stacks of different conductor materials. The gate dielectric may comprise any suitable gate dielectric material, such as oxide, nitride, high-K materials such as Hf-based dielectrics, and combination of different dielectric layers.

Figure 6:
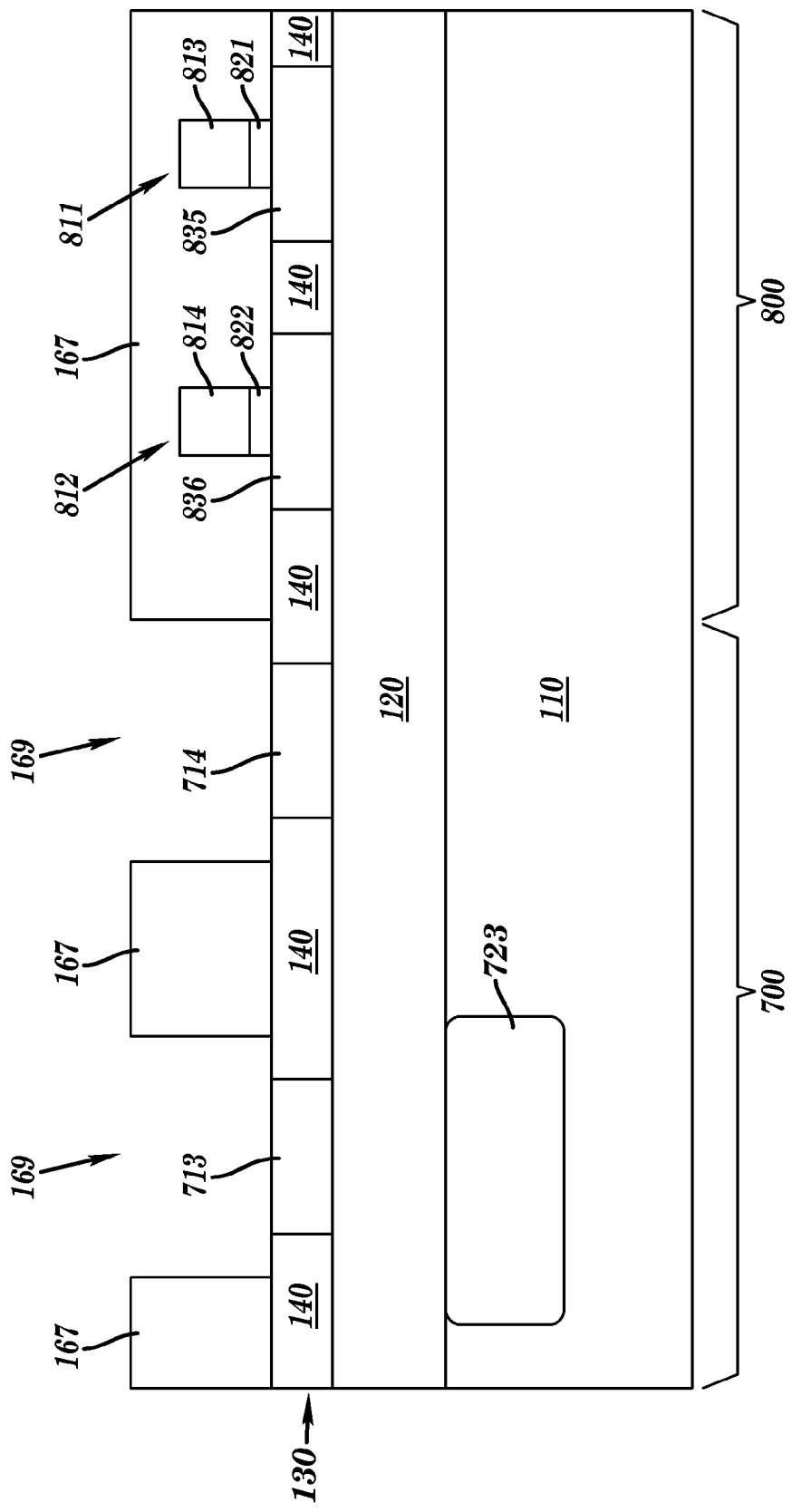
Figure 7:
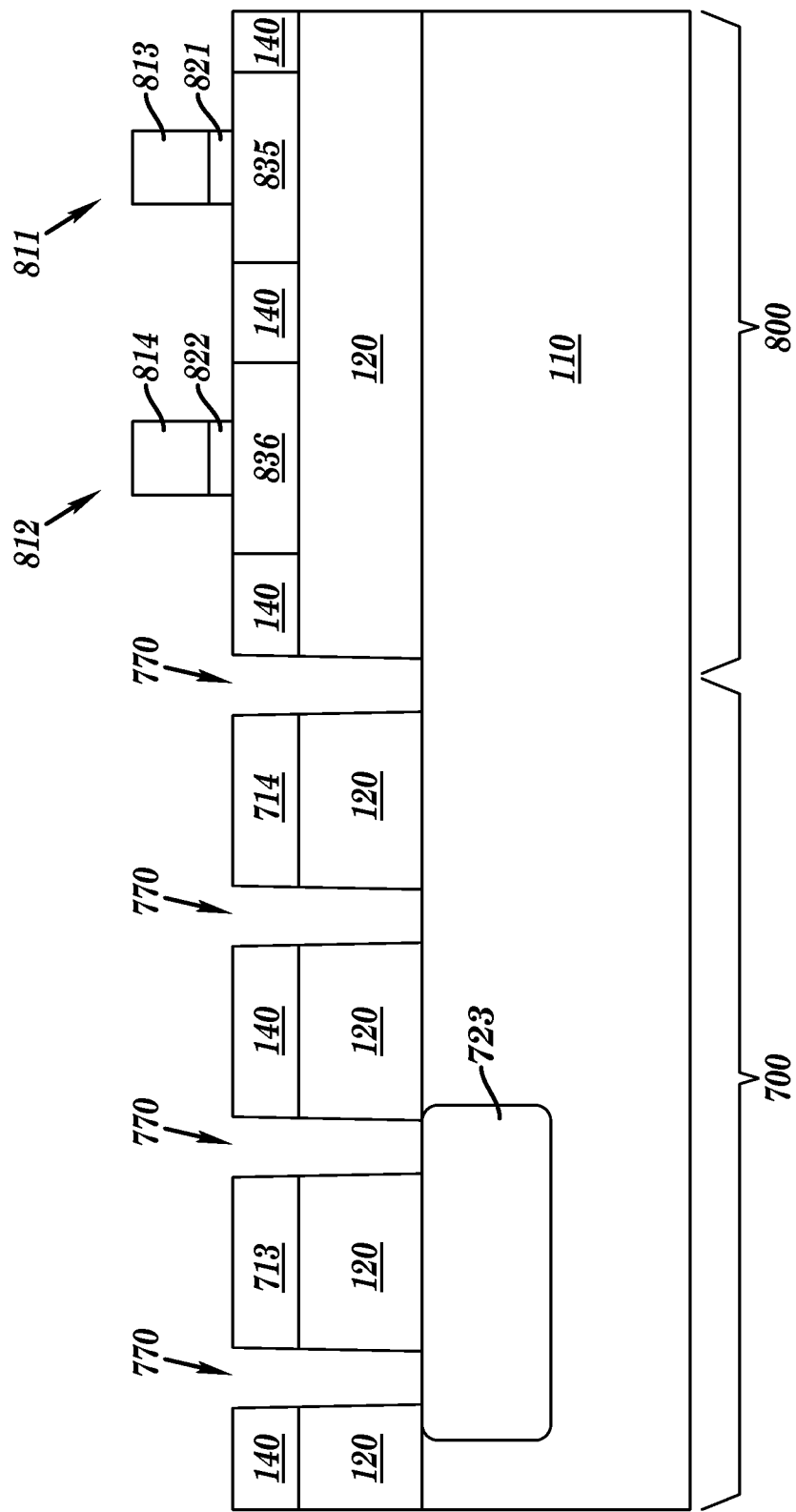

Next, referring to FIG. 6, a second photoresist layer 167 is applied, having patterned openings 169 that expose the STI regions 140 adjacent the active regions 713, 714 in the bulk device region 700. The second resist layer 167 also protects the SOI device region 800. Next, contact trench openings 770 are formed in the bulk device region 700 through STI regions 140 of the SOI layer 130 and BOX layer 120 to expose the substrate 110. Preferably, the contact openings 770 are formed using a self-aligned process in which an anisotropic oxide RIE etch is performed that is selective to the semiconductor active regions 713, 714, which act as a hard mask during the formation of the contact openings 770. Next, the second resist layer 167 is removed, resulting in the structure illustrated in FIG. 7.

Figure 8:
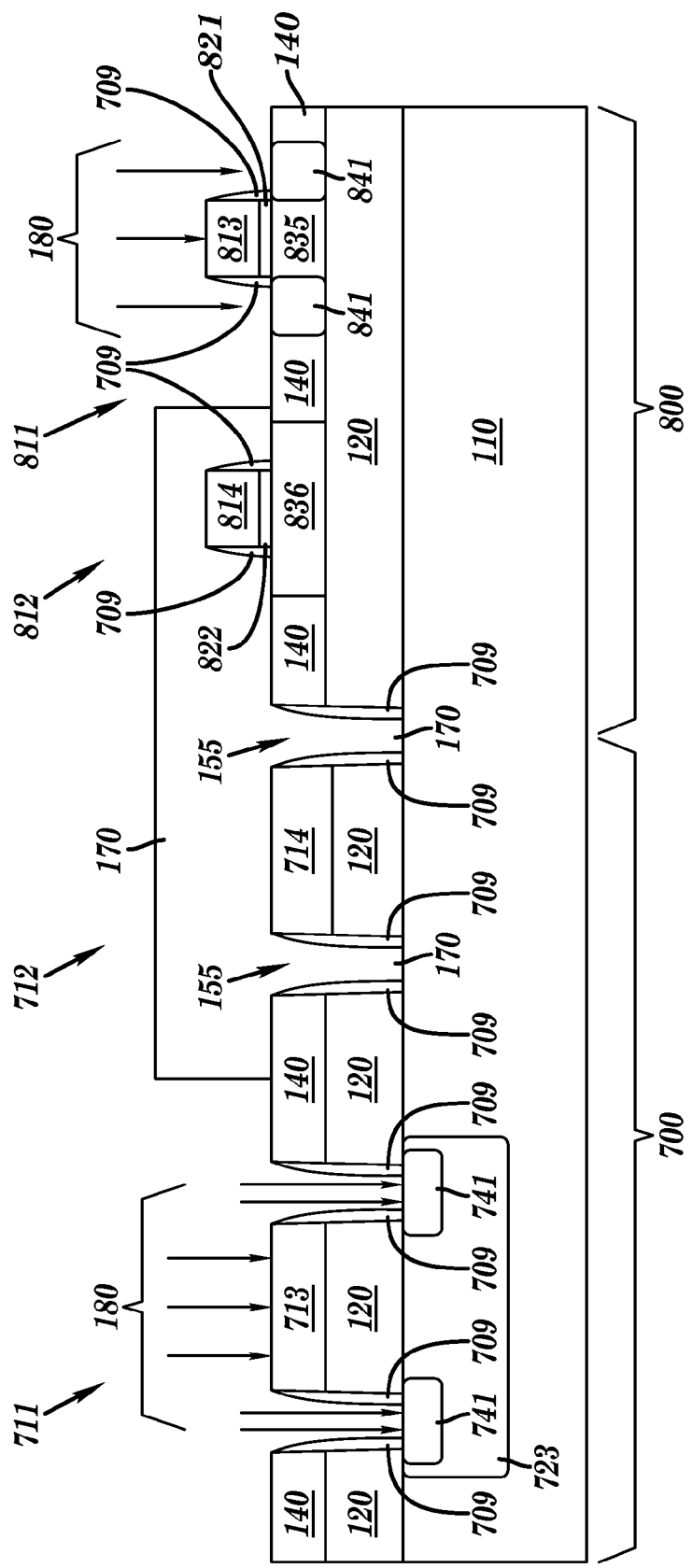

Next, referring to FIG. 8, P-type implants 180 are performed in the PFET regions 711 and 811, to form the bulk S/D regions 741 in the substrate of the bulk region 700 and SOI source/drain (S/D) regions 841 in the active regions 835 of the SOI layer 130 in the SOI region 800. Spacers 709 are typically formed on the sidewalls of the gate stacks 711, 712, 811, 812 prior to the S/D implants, using any method now known or developed in the future. Typically, spacers 709 may be formed by depositing a dielectric layer, followed by a RIE which etches anisotropically in a vertical direction. In this example, the spacers 709 are formed on both sidewalls of the bulk contact trenches 770, as well as on the sidewalls of the SOI gate stacks 811, 812. Optionally, the gate conductor 713 in the bulk region 700 and the gate conductor 821 in the SOI region 700 may be implanted with the P-type implant. During this step, the NFET regions 712, 812 may be protected, for example, by depositing a third resist layer 170. The resist 170 may also fill the contact openings 155 in the NFET region 712 of the bulk region 700.

Figure 9:
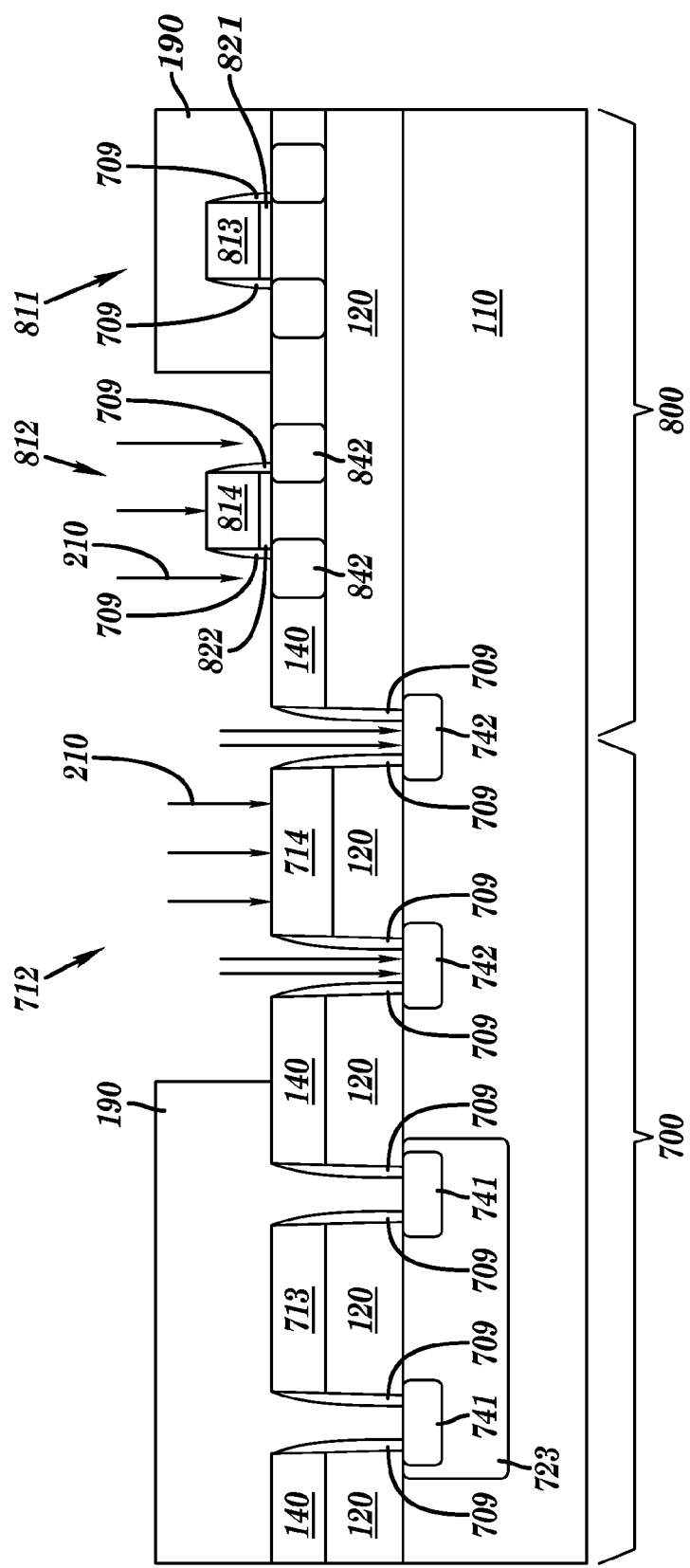
Figure 10:
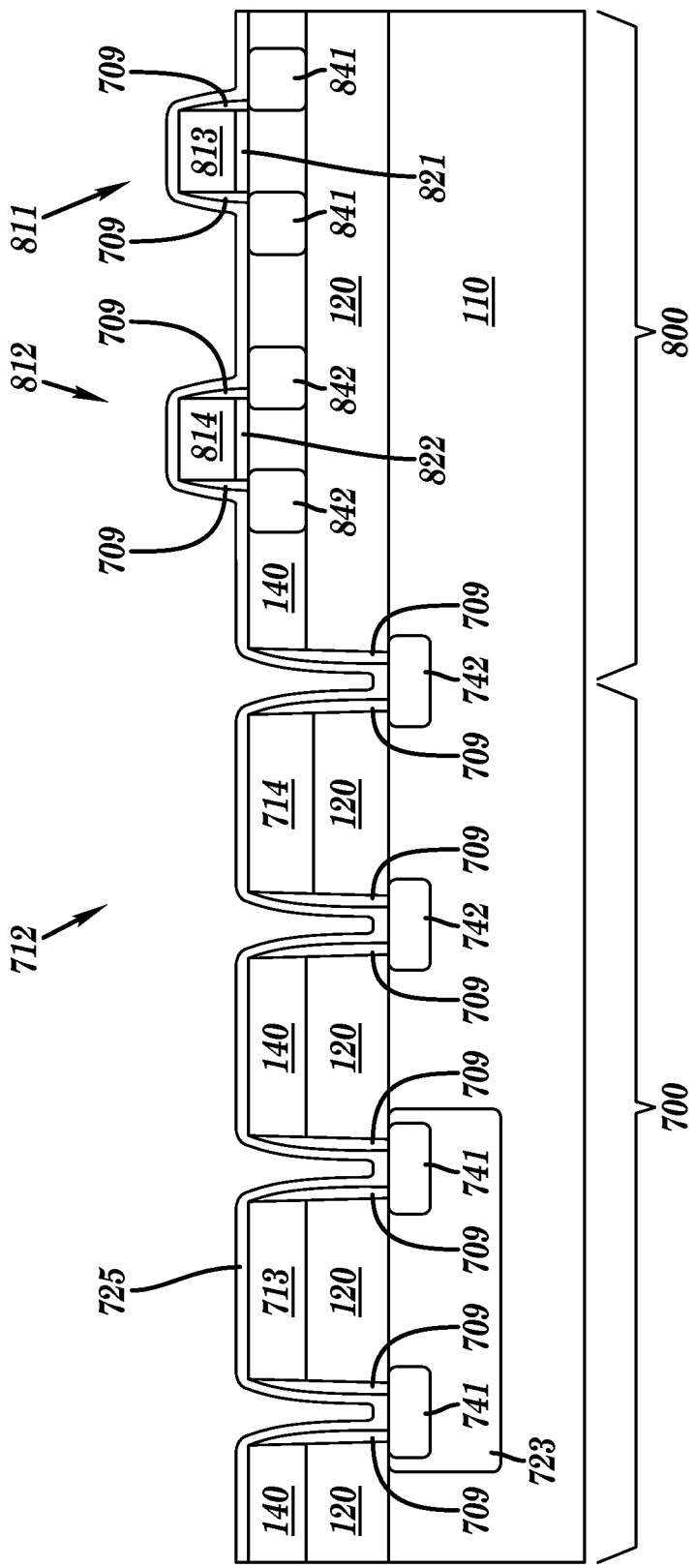

Next, referring to FIG. 9, N-type implants are performed. The third resist layer 170 is removed from over the NFET regions, and from the contact openings 155, for example, by using a wet etch. Subsequently, a fourth resist layer 190 is deposited to protect the PFET regions, patterned to expose the NFET regions. Then, the NFET S/D regions 742, 842 are formed by an N-type implant 210. The NFET gate conductors 714, 814 may also be implanted during this step. Then the fourth resist layer 190 may be removed (not shown).

Figure 11:
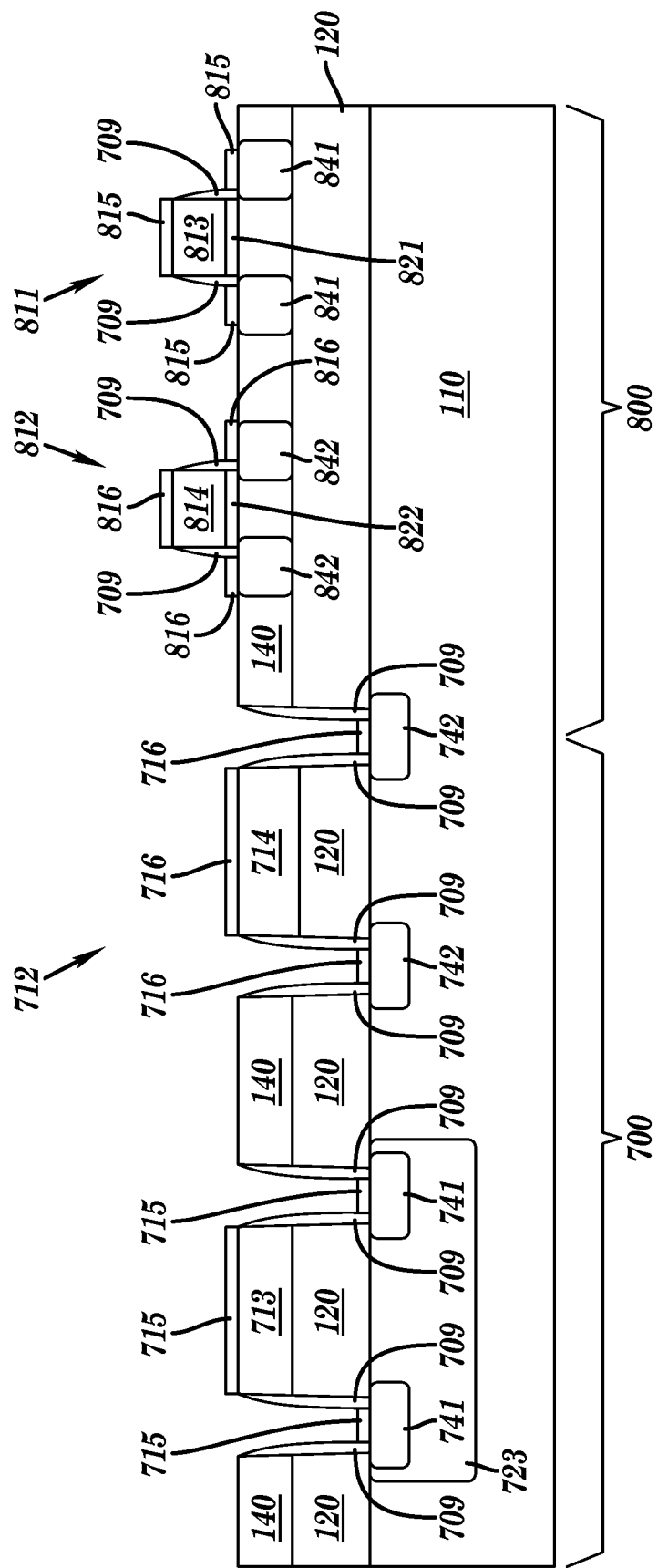

Next, metal-semiconductor alloy layers 715, 716, 815, 816, such as silicide, are formed atop the exposed gate conductors and S/D regions, using any suitable method now known or developed in the future. For example, referring to FIG. 10, a metal layer 725 is blanket deposited over the surface of the wafer, at least covering the top surface of the exposed substrate 110 at the bottom of the contact trenches 770 in the bulk device region 700 and the bulk active regions 713, 714. Similarly, in the SOI device region 800, the top of the gate conductors 813, 814 and the SOI source/drain regions 841, 842 are covered by the metal layer 725. An anneal is performed to form silicide regions 715, 716, 816, 815 where the metal layer covers the semiconductor material, and the remaining unreacted metal is then removed. This is a self-aligned silicide process, also known as a salicide process. The resulting structure is illustrated in FIG. 11. The metal layer 725 may be nickel, cobalt, platinum, etc.

Next, referring to FIG. 1, an interlevel dielectric (ILD) 310 is deposited over the wafer. Using standard processes, a patterned resist is deposited (not shown) and trenches are etched through the ILD 310, and a metal, such as tungsten, is deposited in the trenches, resulting in contacts 751, 752 to the silicide regions 715, 716 on the bulk S/D regions 741, 742, contacts 852, 851 to the silicide regions 816, 815 on the SOI S/D regions 842, 841. Similarly, contacts 753, 754, 853, 854 are formed to connect to the silicide regions 715, 716, 815, 816 atop the gate conductors 713, 714, 813, 814, respectively.

The invention is not limited to a particular type of substrate. For example, referring to FIG. 12, a wafer 1010 may include a N-type substrate 610. The wafer 1010 includes a predefined SOI device region 1000 and a bulk device region 900. In the bulk device region 900, a P-well implant 923 is formed. A NFET 911 is formed in the bulk device region 900, including P+ source/drain regions 941 adjacent a bulk NFET gate conductor 913 atop a bulk NFET gate dielectric 921. The bulk NFET gate dielectric 921 has a thickness equal to the thickness of the buried oxide layer 620 in the SOI device region 1000. Similarly, a bulk PFET device 912 may be formed in the bulk device region 900, which includes P+ source/drain regions 942 adjacent the bulk PFET gate conductor 914 and bulk PFET gate dielectric 922. The bulk PFET gate dielectric 922 has a thickness equal to the thickness of the buried oxide layer 620 in the SOI device region 1000. Both the bulk NFET gate dielectric 921 and bulk PFET gate dielectric 922 have a top surface that is substantially co-planar with the top surface of the buried oxide layer 620 in the SOI device region 1000. The bulk NFET 911 and the bulk PFET 912 also include sidewall spacers 909. In a preferred embodiment, the bulk NFET gate dielectric 921 and bulk PFET gate dielectric 922 are formed from the buried oxide layer of an SOI wafer in a predefined bulk device region 900 of the SOI wafer. By using the existing buried oxide layer as the gate dielectric layer for the bulk FET devices, additional processing, thermal cycles and added cost are avoided. STI regions 640 are formed between devices in the bulk and SOI device regions, located atop a buried oxide layer 620. Sidewall spacers 909 are also formed along the sidewalls of the STI regions 640, 620 in the bulk device region 900. Contacts 951, 952 are formed through the interlevel dielectric 510 adjacent the bulk FET devices to contact silicide regions 915, 916 atop the bulk source/drain regions 941, 942, respectively. Contacts 953, 954 connect to silicide regions 915, 916 atop the bulk gate conductors 913, 914, respectively.

Figure 12:
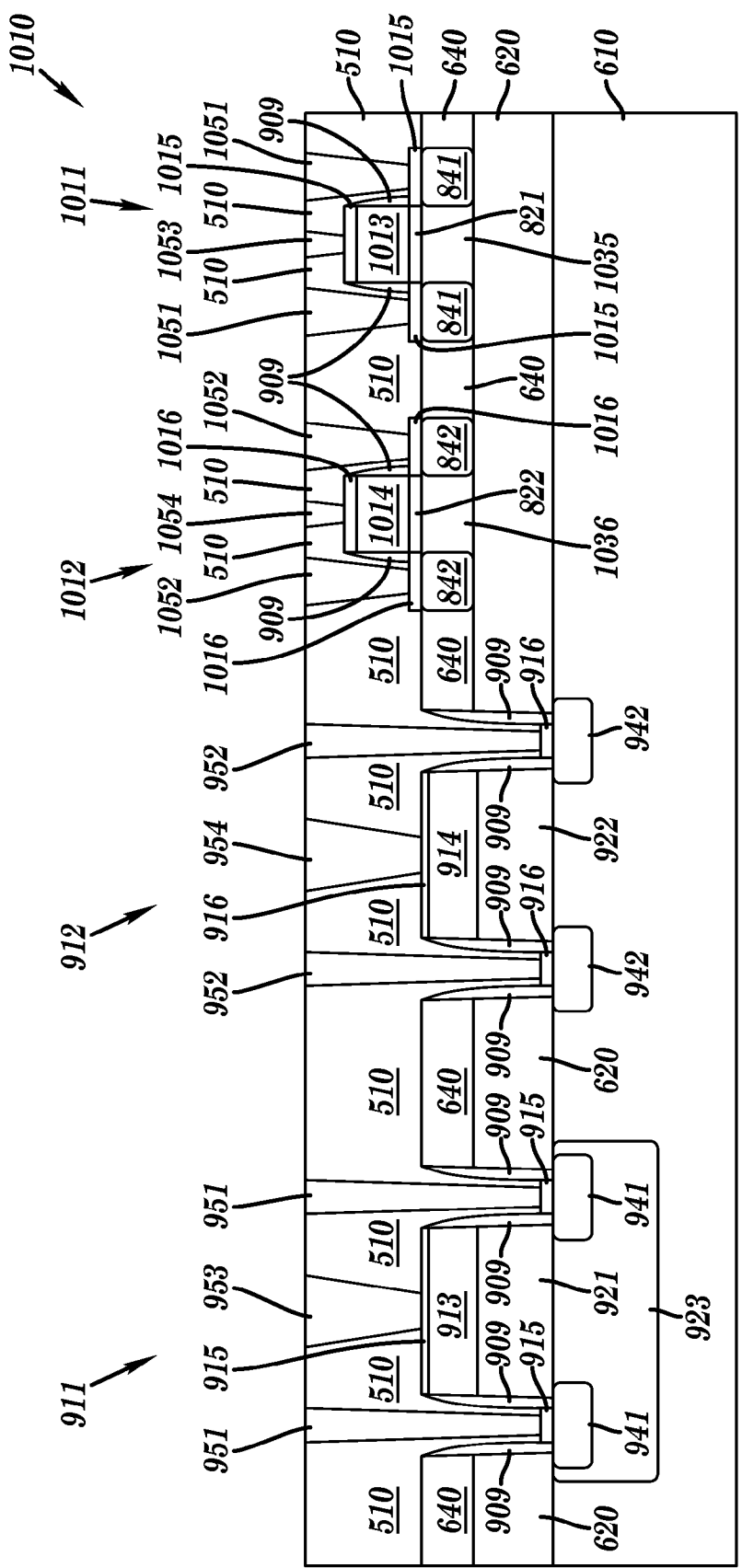
FIG. 12 illustrates another embodiment of a structure in accordance with the present invention.

Still referring to FIG. 12, in the SOI region 1000, a SOI NFET device 1012 and a SOI PFET device 1011 are formed on a semiconductor layer over a buried oxide layer 620. The SOI NFET device 1012 includes a gate conductor 1014 atop a gate dielectric 1022, sidewall spacers 909, and N+ source/drain regions 1042 in the semiconductor layer adjacent the SOI NFET gate conductor 1014. The SOI PFET device 1011 includes a gate conductor 1013 atop a gate dielectric 1021, sidewall spacers 909, and P+ source/drain regions 1041 in the semiconductor layer adjacent the SOI PFET gate conductor 1013. Silicide regions 1016 are formed atop the SOI NFET source/drain regions 1042 and the SOI NFET gate conductor 1014. Contacts 1052, 1054 connect to the silicide regions 1016 through the interlevel dielectric 510. Similarly, silicide regions 1015 are formed atop the SOI PFET source/drain regions 1041 and the SOI NFET gate conductor 1013. Contacts 1051, 1053 connect to the silicide regions 1015 through the interlevel dielectric 510.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed:

1. An integrated circuit comprising:
 a semiconductor wafer comprising a semiconductor on insulator (SOI) device region including a semiconductor substrate, a first SOI semiconductor layer over the semiconductor substrate, and a buried insulating layer formed between the semiconductor substrate and the first SOI semiconductor layer, and said semiconductor wafer comprising a bulk device region;
 an SOI field effect transistor (FET) formed in said SOI device region comprising:
 an SOI gate stack comprising an SOI gate dielectric atop said first SOI semiconductor layer and an SOI gate conductor atop said SOI gate dielectric; and
 SOI source/drain regions in said first SOI semiconductor layer adjacent said SOI gate stack;
 a bulk FET formed in said bulk device region comprising:
 a bulk gate stack comprising a bulk gate dielectric over said semiconductor substrate and a bulk gate conductor atop said bulk gate dielectric, wherein said bulk gate dielectric has a top surface that is substantially coplanar with a top surface of said buried insulating layer in said SOI device region; and
 bulk source/drain regions in said semiconductor substrate adjacent said bulk gate stack.

2. The integrated circuit of claim 1, wherein said bulk FET is an NFET or a PFET.

3. The integrated circuit of claim 1, wherein said bulk source/drain regions are formed in a well region comprising a dopant having a polarity opposite a polarity of said semiconductor substrate.

4. The integrated circuit of claim 1, said bulk FET further comprising at least one contact trench adjacent said bulk gate stack, said at least one contact trench including a contact that is electrically connected to one of said bulk source/drain regions.

5. The integrated circuit of claim 4, said at least one contact trench further comprising a first spacer on a sidewall of said bulk gate stack and a second spacer on a sidewall of an isolation region.

* * * * *